US008416823B2

(12) United States Patent
Coleman et al.

(10) Patent No.: US 8,416,823 B2
(45) Date of Patent: Apr. 9, 2013

(54) QUANTUM WELL ACTIVE REGION WITH THREE DIMENSIONAL BARRIERS AND FABRICATION

(75) Inventors: James J. Coleman, Monticello, IL (US); Victor C. Elarde, Evanston, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 12/598,224

(22) PCT Filed: Apr. 29, 2008

(86) PCT No.: PCT/US2008/005508
§ 371 (c)(1),
(2), (4) Date: Apr. 22, 2010

(87) PCT Pub. No.: WO2009/023046
PCT Pub. Date: Feb. 19, 2009

(65) Prior Publication Data
US 2010/0208761 A1    Aug. 19, 2010

Related U.S. Application Data

(60) Provisional application No. 60/927,721, filed on May 4, 2007.

(51) Int. Cl.
*H01S 5/00*      (2006.01)
(52) U.S. Cl. ........ 372/45.01; 257/14; 438/478; 977/755
(58) Field of Classification Search ............... 372/45.01; 257/14; 438/478; 977/755
See application file for complete search history.

(56) References Cited

U.S. PATENT DOCUMENTS

| 6,879,612 | B1 * | 4/2005 | Wasserbauer | 372/50.1 |
| 6,914,256 | B2 * | 7/2005 | Zhang et al. | 257/15 |
| 2004/0184500 | A1 * | 9/2004 | Kuwata | 372/46 |
| 2005/0152429 | A1 * | 7/2005 | Scherer | 372/92 |
| 2006/0081832 | A1 | 4/2006 | Chen | |
| 2006/0083278 | A1 | 4/2006 | Tan et al. | |
| 2006/0134931 | A1 | 6/2006 | Lin | |
| 2007/0057270 | A1 | 3/2007 | Bour et al. | |

OTHER PUBLICATIONS

Bhattacharya, et. al., "Carrier Dynamics and High-Speed Modulation Properties of Tunnel Injection inGaAs-GaAs Quantum-Dot Lasers", *IEEE Journal of Quantum Electronics* vol. 39; No. 8; Aug. 2003.
Birudavolu, S. et al., "Selective area growth of InAs quantum dots formed on a patterned GaAs substrate", *Applied Physics Letters* vol. 85, No. 12. Sep. 20, 2004.
Blood, Peter, "On the Dimensionality of Optical Absorption, Gain, and Recombination in Quantum-Confined Structures", *IEEE Journal of Quantum Electronics*, vol. 36, No. 3, Mar. 2000.

(Continued)

*Primary Examiner* — Yuanda Zhang
(74) *Attorney, Agent, or Firm* — Greer, Burns & Crain Ltd.

(57) ABSTRACT

The invention provides a quantum well active region for an optoelectronic device. The quantum well active region includes barrier layers of high bandgap material. A quantum well of low bandgap material is between the barrier layers. Three-dimensional high bandgap barriers are in the quantum well. A preferred semiconductor laser of the invention includes a quantum well active region of the invention. Cladding layers are around the quantum well active region, as well as a waveguide structure.

23 Claims, 8 Drawing Sheets

OTHER PUBLICATIONS

Elarde, et. al., "Controlled fabrication of InGaAs quantum dots by selective area epitaxy MOCVD growth", Journal of Crystal Growth, vol. 272 p. 148-153, Oct. 12, 2004.

Elarde, et. al., "Room-Temperature Operation of Patterned Quantum-Dot Lasers Fabricated by Electron Beam Lithography and Selective Area Metal-Organic Chemical Vapor Deposition", *IEEE Photonics Technology Letter*, vol. 17, No. 5, May 2005.

Elarde, et. al., "High performance laser with nanopatterned active layer by selective area epitaxy" *Electronic Letters*, vol. 41, No. 20, Sep. 29, 2005.

Elarde, et, al., "Spectral and threshold performance of patterned quantum dot lasers", *phys. stat. sol.* 3, No. 3, p. 508-511 2006.

Shchekin, at al., "Discrete energy level separation and the threshold temperature dependence of quantum dot lasers", *Applied Physics Letters* vol. 77, No. 4, Jul. 24, 2000.

Uskov et al., "On Ultrafast Optical Switching Based on Quantum-Dot Semiconductor Optical Amplifiers in Nonlinear Interferometers", *IEEE Photonics Technology Letters*, vol. 16, No. 5, May 5, 2004.

* cited by examiner

QUANTUM WELL ACTIVE REGION WITH THREE DIMENSIONAL BARRIERS AND FABRICATION

PRIORITY CLAIM AND REFERENCE TO RELATED APPLICATION

This application claims priority under 35 U.S.C. §119 from prior provisional application Ser. No. 60/927,721, filed May 4, 2008.

STATEMENT OF GOVERNMENT INTEREST

This invention was made with government support under DARPA Contract No. 433143-874a and NSF Contract No. 03-35082. The government has certain rights in the invention.

FIELD

A field of the invention is semiconductors. Another field of the is invention is semiconductor lasers.

BACKGROUND

Semiconductor lasers are the fundamental building block in compact photonic and optoelectronic devices. Formed from Group III-V semiconductors, the semiconductor lasers emit laser light in response to electrical stimulation as electrons relax back to lower energy states and emit photons. Some semiconductor lasers use quantum wells, which confine carriers in a manner that forces the carriers to occupy an essentially planar two-dimensional region.

Quantum dots are currently used in optoelectronic devices to realize potential improvements in speed and extension of accessible wavelength ranges. The generation of terahertz frequencies is currently of interest in the Group III-V semiconductor field because of many potential applications in areas including national security and environmental sensing. The most successful device to date for generating terahertz frequencies is the quantum cascade laser which utilizes very precisely controlled, nanoscale structures in one-dimension. These structures are designed to facilitate intraband carrier recombination with transition energies in the terahertz regime. The quantum cascade lasers offer limited engineering control over the intraband band gaps.

DISCLOSURE OF THE INVENTION

The invention provides a quantum well active region for an optoelectronic device. The active region includes a continuous quantum well layer of low bandgap material and barrier layers of high bandgap material. A quantum well of low bandgap material is between barrier layers. Three-dimensional high bandgap barriers are in the quantum well and perforate the quantum well layer. The barriers can be an ordered array, or can be a random pattern. A preferred semiconductor laser of the invention includes an active region of the invention. Cladding layers are around the active region, and comprise a waveguide structure.

In a preferred method for forming the active region of the invention an array of nanometer scale growth inhibition dots is formed on the active region barrier layer. A quantum well is formed on the quantum well barrier layer. The growth inhibition dots are removed. Three-dimensional barriers are formed in nanopores left in the spaces vacated by growth inhibition dots and an upper barrier layer is formed. Another method for forming the quantum well with nanopores is to form a an uninterrupted quantum well layer and then use a suitable material removal process, such as etching with a patterned mask, to form pores into the quantum layer subsequent to formation of the quantum well layer.

DETAILED DESCRIPTION OF THE PREFERRED EMBODIMENTS

Figure 1:
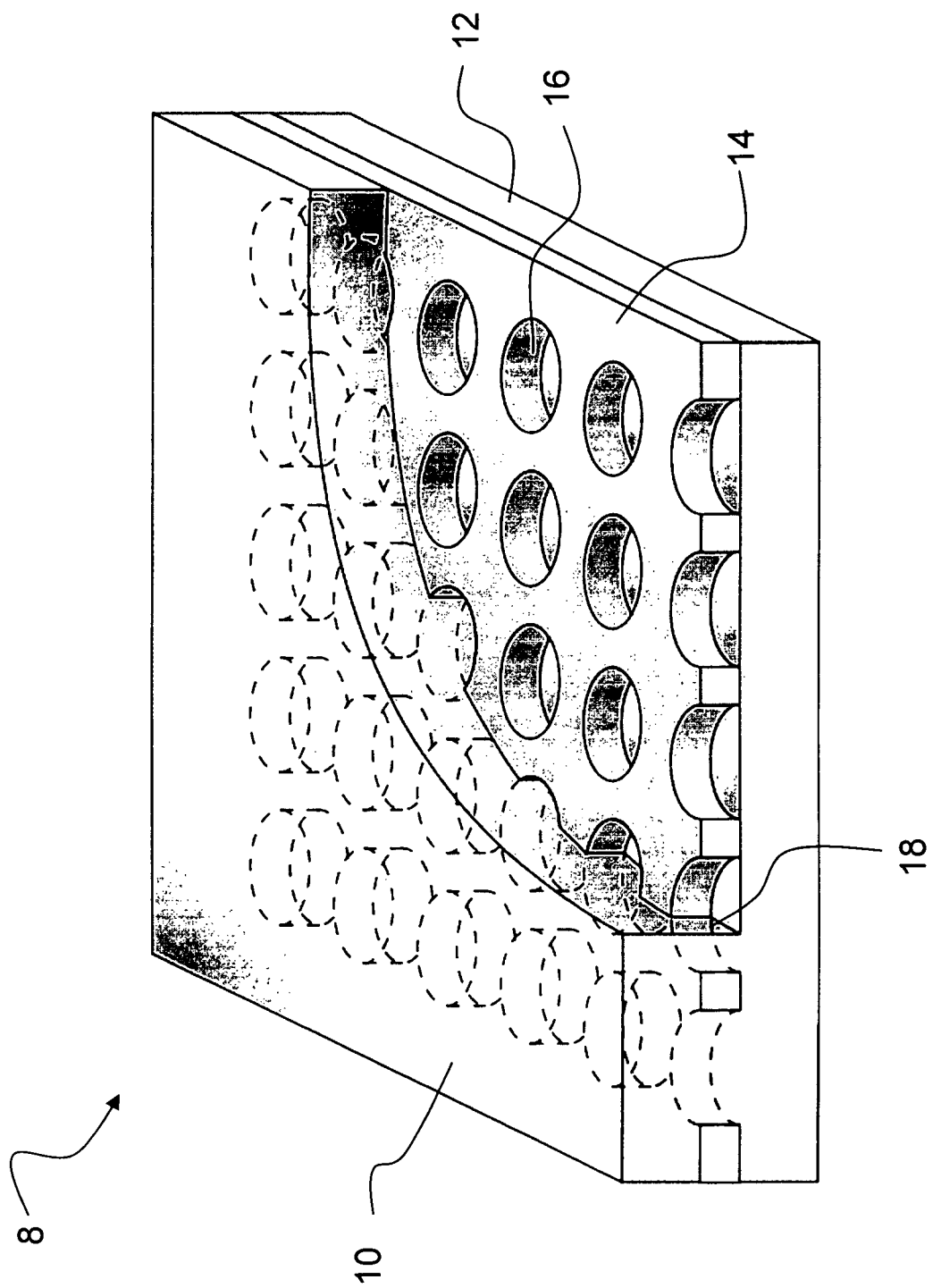
FIG. 1 is a partial cut-away schematic perspective view of a preferred embodiment three-dimensional barrier active region of the invention.

The invention provides a quantum well active region for an optoelectronic device. The active region includes barrier layers of high bandgap material. A quantum well of low bandgap material is between the barrier layers. Three-dimensional high bandgap barriers are in the active layer. A preferred semiconductor laser of the invention includes an active region of the invention. Cladding layers are around the quantum well, and comprise a waveguide structure.

The invention provides a three-dimensional barrier active region quantum well that achieves artificially induced quantization of carriers in a semiconductor optoelectronic device. A three-dimensional barrier active region quantum well of the invention includes a perturbed quantum well containing higher-energy bandgap barrier regions embedded in the quantum well. The high energy barrier regions can be arranged in an ordered pattern, such as an ordered hexagonal lattice or another ordered pattern, or can be randomly distributed. Generally, there is a quantum size spaced pattern of higher-energy bandgap barrier regions that can be arranged in a periodic or random pattern.

An embodiment of the invention is a quantum well active region three-dimensional barrier semiconductor structure. An ordered array of nanopores with high bandgap material in the pores of a quantum well creates a periodic perturbation of a thin layer of low bandgap material surrounded by high bandgap material (a quantum well in barrier layers). The nanopores with high bandgap material act as an array of localized high bandgap regions and provide fully three-dimensional quantization of carriers. Dimensions of the quantum well are on the order of the wavelength of carriers in the semiconductor material. The wavefunction of the carriers in this quantum well are modified from that of a normal quantum well such that bands of forbidden energies appear in the dispersion relation.

A three-dimensional barrier quantum well active region of the invention can manipulate the energy states of carriers, and achieve an energy configuration similar to that achieved in quantum dot structures, but with carrier wave functions that are much more highly distributed, leading to advantages over quantum dots for many common applications. In particular, the energy state broadening in the quantum well of the invention is much more homogeneous than that found in conventional quantum dots. A preferred device of the invention is a buried heterostructure laser with the active region of the invention having including confinement achieved with an ordered array of three-dimensional barriers.

A method of fabrication of the invention uses selective area epitaxy and electron beam lithography. An array of growth inhibition dots is formed on a material layer. The growth inhibition dots inhibit material deposition during subsequent growth of a thin film semi-conductor material on the material layer. The thin film thus grows as a perforated film with an array of nanopores corresponding to the location of the growth inhibition dots. In alternative methods of the invention, the quantum well can be formed first and then patterned by a material removal process, such as by patterned etching.

In a preferred method for forming a quantum well, a quantum well barrier layer is formed. An array of nanometer scale growth inhibition dots is formed on the quantum well barrier layer. A quantum well layer is formed on the quantum well barrier layer. The growth inhibition dots are removed. Three-dimensional barriers are formed in nanopores left in the spaces vacated by growth inhibition dots and an upper quantum well barrier is formed.

Artisans will recognize many potential applications for the three-dimensional barrier active region of the invention. Semiconductor structures of the invention provide a mechanism for the manipulation of the energy states of carriers in many semiconductor systems. With the invention, a greater degree of engineering control is afforded to achieve manipulation of energy states in carriers than in quantum dot devices. The three-dimensional barrier quantum well of the invention allows for the formation of intraband gaps, indicating the same type of transition energy levels of quantum cascade lasers are achievable. Relative terms, e.g., top bottom, are only as a point of reference for the presentation in the drawings.

Preferred embodiments will now be discussed with respect to the drawings. Schematic representations will be understood by artisans with reference to the discussion. Features may be exaggerated for purposes of illustration, and the drawings are not to scale.

FIG. 1 illustrates a preferred embodiment three-dimensional barrier quantum well active region 8 of the invention. The quantum well active region 8 includes barrier layers 10, 12 and a thin quantum well 14 with an ordered array of nanopores 16. The nanopores 16 are filled with high bandgap material and act as an array of localized high bandgap regions surrounded by low bandgap material and provide fully three-dimensional quantization of carriers. High bandgap material from the top barrier layer 10 extends into nanopores 16 to form three dimensional barrier regions 18 in the low bandgap thin quantum well 14. The thickness of the thin quantum well 14 is on the order of the wavelength of carriers in the particular semiconductor materials used to form the quantum well 14, typically 10 s of nanometers or down to a few monolayers. In principal, the quantum well can be a single monolayer. It can also be comprised of several wells with interspersed barriers, known commonly as a multi-quantum well (MQW). In practice, a typical well is 5-10 nm. The wavefunction of the carriers in the quantum well 14 are modified from that of a normal quantum well such that bands of forbidden energies appear in the dispersion relation.

Quantum well energy states are typically modeled using a one-dimensional, finite barrier, particle-in-a-box along the direction perpendicular to the plane of the quantum well. In plane, the free-electron model is typically used. In the free-electron model, a parabolic relationship exists between the electron's in-plane momentum wave vector and its energy. The three-dimensional barrier quantum well 14 can be modeled using the same one-dimensional particle-in-a-box model for the perpendicular direction. In plane modeling requires a modification of the free-election model. The two-dimensional, in-plane quantum well of the three-dimensional barrier quantum well 14 can be modeled as a low-energy background perturbed in a periodic manner by circular, higher-energy, barrier regions. In the example ordered quantum well 8 of FIG. 1, the barrier regions 18 are arranged on a hexagonal lattice.

Figure 2:
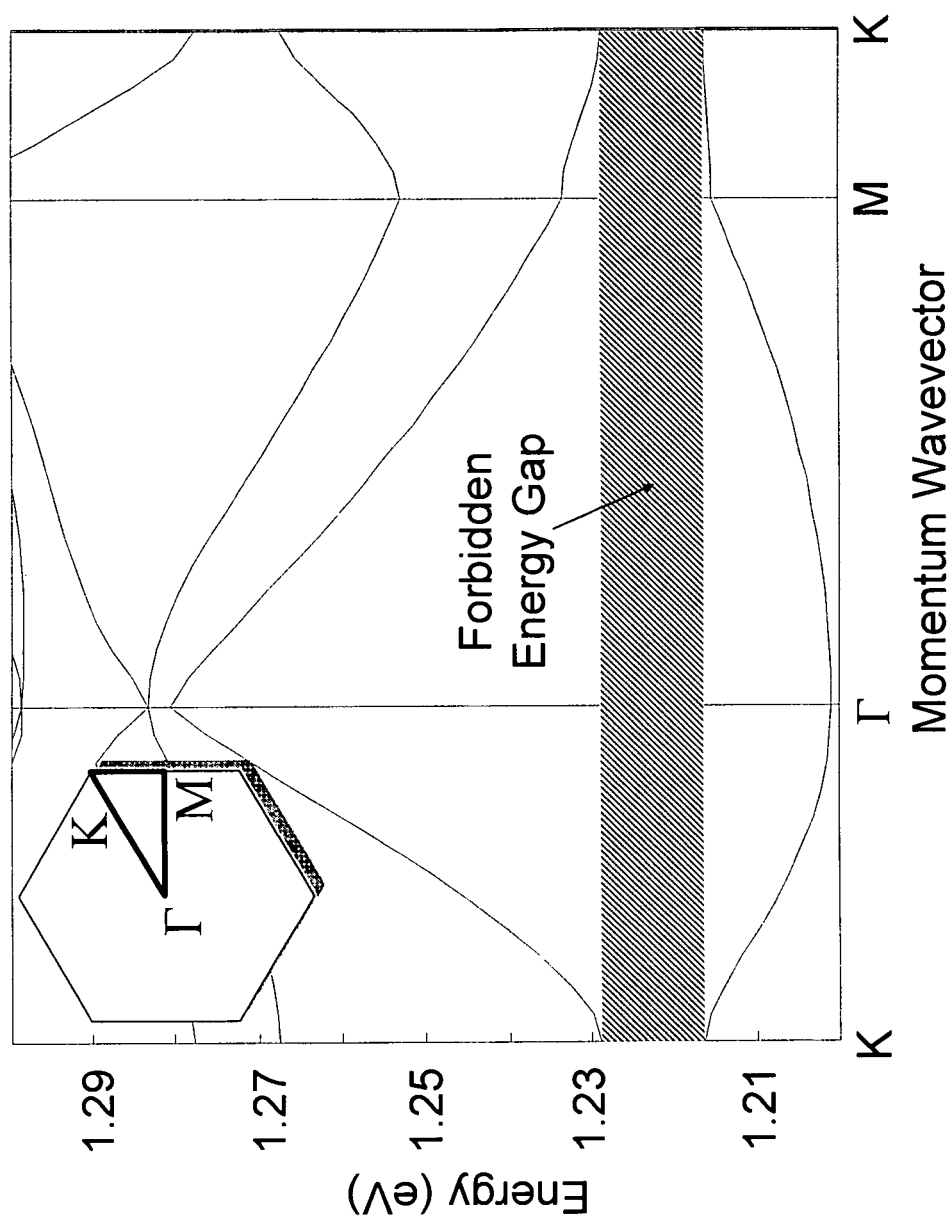
FIG. 2 shows the calculated dispersion relation for a 10 nm barrier region with 20 nm pitch three-dimensional barrier quantum well consistent with FIG. 1.

FIG. 2 shows the calculated dispersion relation for a quantum three-dimensional barrier quantum well consistent with FIG. 1. The calculated dispersion relation uses 10-nm diameter barrier regions arranged on a hexagonal lattice with a center-to-center spacing of 20-nm. The forbidden energy gap created by the periodic quantum well is illustrated and has a width and position that depends on the size and period of the filled nanopores. The inset illustrates the first Brillouin zone with bounding points labeled.

The energy structure of the three-dimensional barrier quantum well 14 can be calculated using a numerical method, namely the Finite Difference Method (FDM), applied to a single unit cell of the periodic array. Periodic boundary conditions are necessarily used as the wavefunctions corresponding to the solutions are highly distributed for this structure. Interactions between neighboring unit cells therefore cannot be neglected as is often done for the case of quantum dots. This system can be solved to find the dispersion relation over the first Brillouin zone for the three-dimensional barrier structure. The periodically arranged barriers result in the formation of an intraband, forbidden energy gap, as seen in FIG. 2. The forbidden energy band forms as a result of resonant scattering of carriers by the periodically arranged barrier regions. Conceptually, this effect is similar to the formation of the photonic bandgap in a photonic crystal through resonant scattering of photons by the periodic index of refraction structure.

Figure 3:
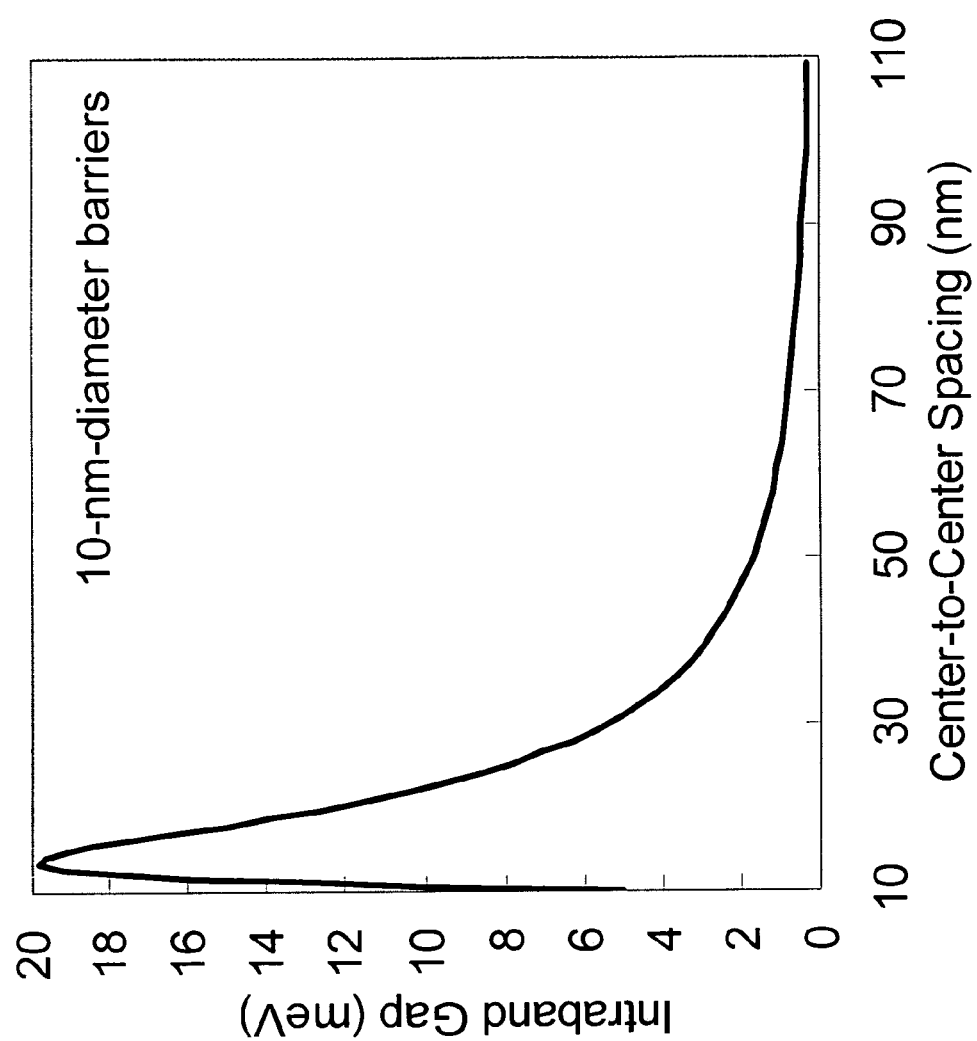
FIG. 3 shows the calculated intraband gap energy for 10 nm barrier regions spaced at different pitches in a quantum well consistent with FIG. 1.

Fabrication methods of the invention permit the nanopore (and therefore barrier) geometry to be controlled to include nanopores, and therefore barrier regions, of different sizes and arranged at different pitches in the array. Through manipulation of the nanopore geometry, the size of the intraband energy gap can be controlled and, therefore, designed for a particular application. FIG. 3 illustrates the calculated intraband gap for a quantum three-dimensional barrier quantum well consistent with FIG. 1, with 10-nm-diameter barrier regions having a number of different pitches. The barrier regions are arranged on hexagonal lattice with a number of different center to center spacings.

Figure 4:
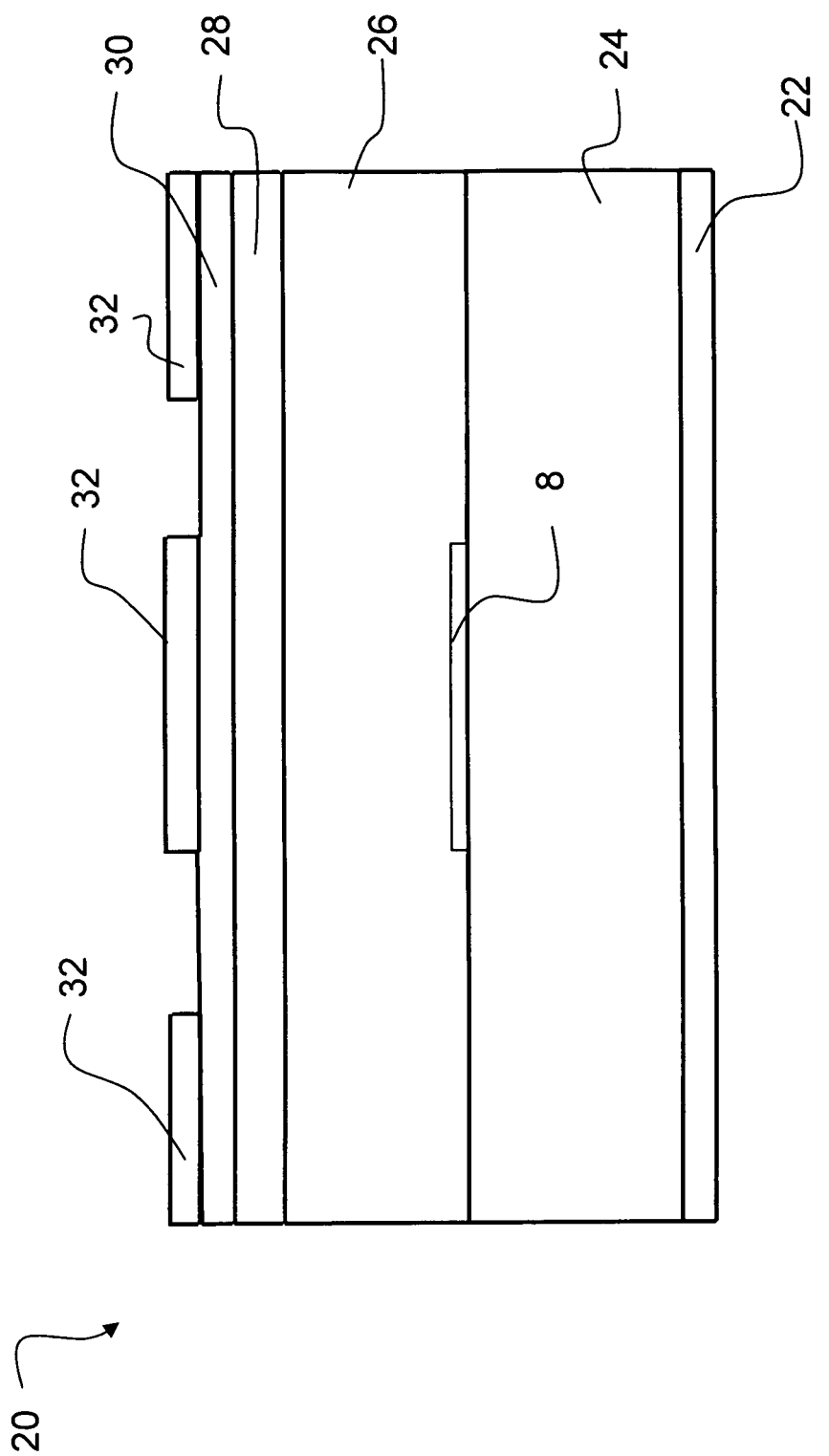
FIG. 4 is a schematic side view of an FIG. 4 of preferred embodiment ridge-waveguide semiconductor laser including a quantum nanopore structure.

FIG. 4 illustrates an example preferred embodiment ridge-waveguide semiconductor laser 20 including a three-dimensional barrier active region as illustrated in FIG. 1. The active region of the invention can be utilized in any diode laser waveguide geometry. The laser 20 includes a lower contact 22 on a substrate 23 and lower cladding layer 24. The barrier 12 (see FIG. 1) forms a lower barrier layer of the quantum well active region 8 upon said lower cladding layer. The quantum well 14 including three-dimensional barriers (see FIG. 1) is between the barrier layer 12 and the barrier layer 10, portions of which form the barrier regions 18 (FIG. 1) to create an array of localized high bandgap regions. An upper cladding layer 26 defines a buried heterostructure that is aligned with the quantum well active region 8. The upper cladding 26 need not be a separate layer from the upper barrier layer, as the upper barrier 10 and 26 can be formed as a regrowth step as described below. A second upper cladding layer 28 completes an upper cladding of the laser 20. A contact layer 30 is upon the second upper cladding layer 28. A contact stripe 32 is formed on the contact layer and is aligned with the buried heterostructure. End facets are formed perpendicular to the page, and emission will be perpendicular to the page. In an embodiment of the invention, the quantum well active region of the invention is a multiple quantum well active region (MQW), having at least one quantum well 14 with three dimensional barriers 18, and upper and lower barriers 10, 12. Additional quantum wells can also have three dimensional barriers 18, or can be conventional quantum wells.

The materials for the various layers can be suitable Group III-V materials. Experimental devices will be discussed along with example materials used in the experimental devices. In experiments, a laser consistent with FIGS. 1 and 4 has been fabricated and tested. The fabrication steps will be discussed along with the particular materials and equipment used in the experiments. Artisans will appreciate the broader aspects of the fabrication process of the invention and recognize that other equipment can be used. Artisans will understand broader aspects and additional features of the invention from the prototype devices and experimental fabrications, and also appreciate that the invention is not limited to the specific semi-conductor materials in the experiments.

Example devices were fabricated on an n-type, GaAs wafer. A 1-μm-thick layer of n-type, $Al_{0.75}Ga_{0.25}As$ is formed on the wafer, and serves as the lower cladding 24. A 100-nm-thick intrinsic layer of GaAs, forms the lower barrier 12. Photoresist, in the experiments, Hydrogen silsesquioxane (HSQ) is then spun on the wafer and electron beam lithography was performed in a JEOL JBX-6000 series electron beam lithography tool. The pattern consists of an array of points on a hexagonal lattice with 80-nm center-to-center spacing. The HSQ becomes silicon dioxide in the areas where it was written. The silicon dioxide acts as a selective area growth mask in a subsequent regrowth step. The unwritten HSQ is developed away using a solution of tetra-methyl-ammonium-hydroxide (TMAH). This leaves an array of silicon dioxide dots of approximately 40-nm diameter on the surface. These dots locally inhibit material deposition during the subsequent growth of a thin layer of semiconductor material, e.g., InGaAs. The thin film resulting from this growth is thus perforated by an ordered array of holes with diameters on the order of 10 s of nanometers and arranged on a 80 nm pitch, hexagonal lattice. The silicon dioxide dots are removed, and the top half of the laser structure is grown on top. The completed quantum well structure contains a thin layer of lower bandgap material, InGaAs in this case, which has been perforated with a higher bandgap barrier material, in this case GaAs. Layers of GaAs are also present on top and below the thin InGaAs layer. The latter part of the formation process including removal of the dots and completion of the upper part of the layer will be described.

With the dots in place, the sample is returned to the reactor for the growth of an 8-nm-thick layer of $In_{0.25}Ga_{0.75}As$ as the quantum well 14 and a 10-nm-thick GaAs cap which forms part of the upper barrier 10. The silicon dioxide dots are then removed using buffered hydrofluoric acid solution and the sample is, again, returned to the reactor for the growth of the upper cladding 26. This regrowth consists of a 90-nm-thick layer of intrinsic GaAs. Next, 4-μm-wide ridges are etched over the three-dimensional barrier regions to act as a lateral waveguide for the completed devices. The etch was performed using 1:8:80 $H_2SO_4:H_2O_2:H_2O$, and was approximately 125-nm deep. This depth was determined to be optimal (in view of the depth of other layers) to form a single-lateral-mode waveguide and also sufficiently deep to remove the quantum well region immediately surrounding the nanopore region to avoid carrier diffusion into that region during device operation. Finally, a third regrowth step is performed which consists of a 10-nm-thick layer of intrinsic GaAs to complete the upper barrier 10, including the barrier regions 18, a 1-μm-thick layer of p-type $Al_{0.75}Ga_{0.25}As$ to provide the upper cladding 28, and a 100-nm-thick, GaAs p+ layer that forms the contact layer 30.

A 1000-Å-thick layer of $SiO_2$ is then deposited by plasma-enhanced chemical vapor deposition (PECVD) and 3-μm-wide stripes are etched above the buried ridges to form a current aperture. Top-side contact metals are then deposited which consist of Ti, Pt, and Au to form the contacts 32. The sample is then thinned to ~100 μm to facilitate cleaving. Finally, back-side contact metals are deposited, consisting of Ge:Au, Ni, and Au, to form the contact 22. The sample is then diced into individual devices with 1-mm cavity lengths. In addition to the devices containing a nanopore quantum well, devices from unpatterned regions of the sample are fabricated as well. These devices contain an ordinary quantum well active region and are used as control devices for comparison to the nanopore lasers.

Figure 5:
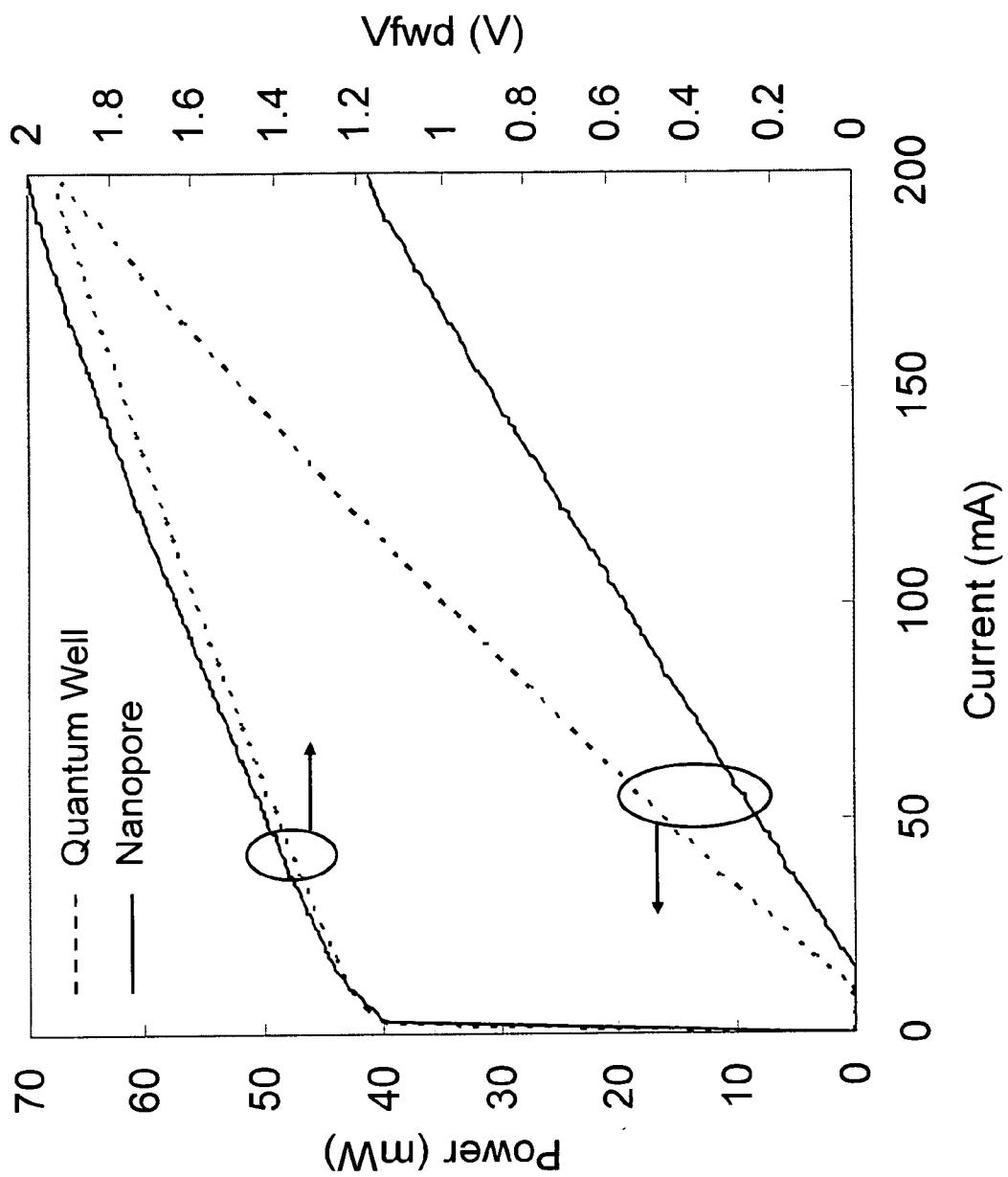
FIG. 5 plots light vs. current and voltage vs. current data for experimental standard quantum well and quantum nanopore buried ridge waveguide lasers.

Both the nanopore lasers and quantum well lasers were tested under pulsed current injection at room temperature using 2-μs pulse widths with a 0.3% duty cycle. The light vs. current and voltage vs. current data for both device types are presented in FIG. 5. The slope efficiency of the nanopore devices is slightly lower than that of the quantum well devices. This is believed to be due to damage to the crystal structure caused by the electron beam lithography, and can be avoided by modifying the lithography to avoid damage. A similar, although less substantial, decrease in quantum efficiency has been observed for prior patterned quantum dot devices. The more dramatic reduction in quantum efficiency observed in the nanopore devices is consist with the higher dose required for HSQ exposure (used for the nanopore process) than for PMMA exposure (used for the patterned quantum dots).

Figure 6:
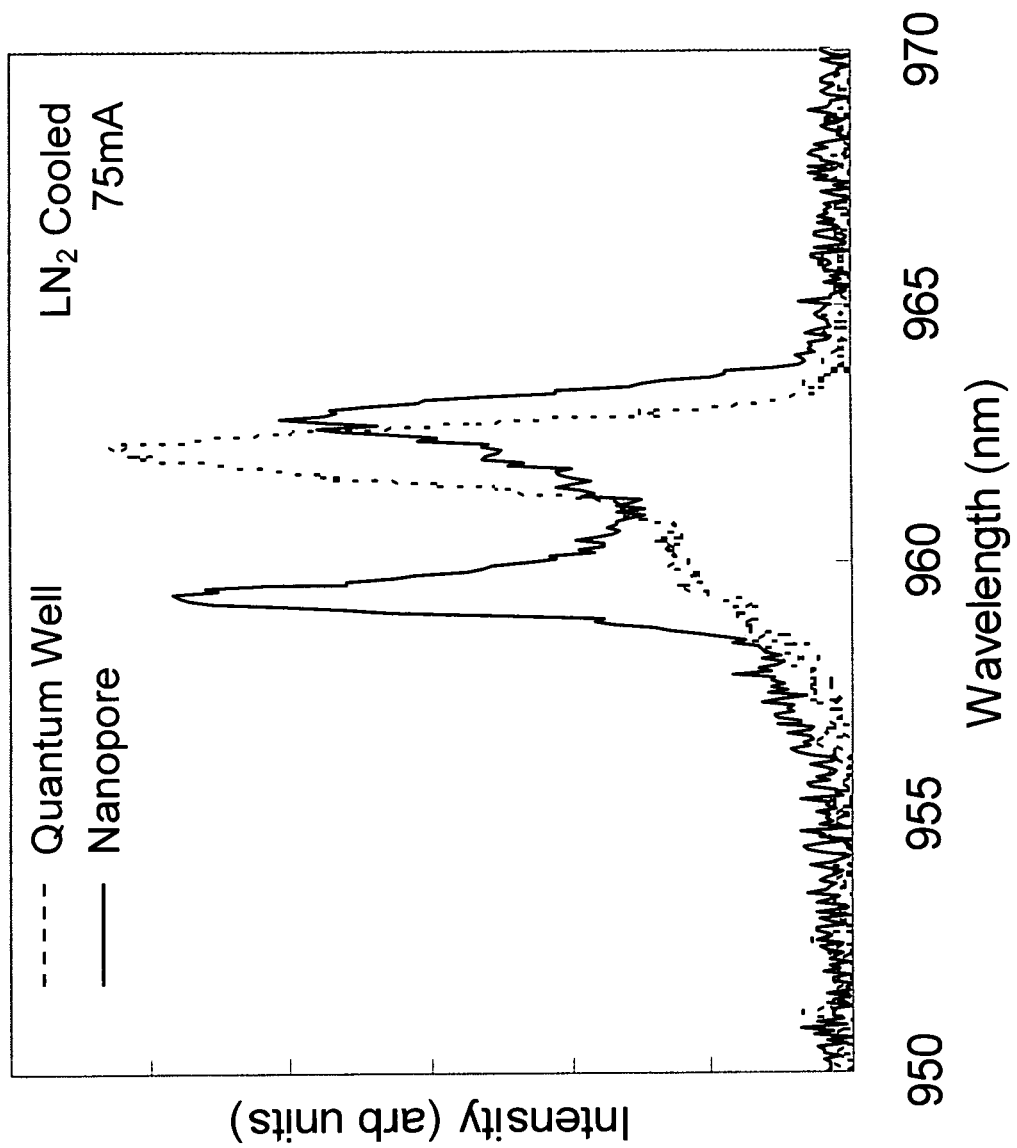
FIG. 6 is a comparison of the nanopore and quantum well emission spectra under identical injection conditions.

A series of spectra corresponding to a range of injection currents was taken from both the nanopore and quantum well devices in an evacuated chamber on a liquid nitrogen cooled stage. The nanopore devices exhibited a distinct, dual-peaked spectrum over a large range of injection currents which tends to demonstrate the presence of an intraband forbidden energy gap. The two peaks correspond to emission from both the ground state and excited state emission bands. A comparison of the nanopore and quantum well emission spectra under identical injection conditions is presented in FIG. 6. The ground state band emission of the nanopore laser is also slightly red shifted compared to the emission from the quantum well device. This is likely due to a small amount of growth rate enhancement in the patterned regions during the regrowth of the quantum well due to the reduced surface area. This results in a slightly thicker quantum well for the nanopore devices compared to conventional quantum well devices and a corresponding red shift of the emission spectrum.

Figure 7:
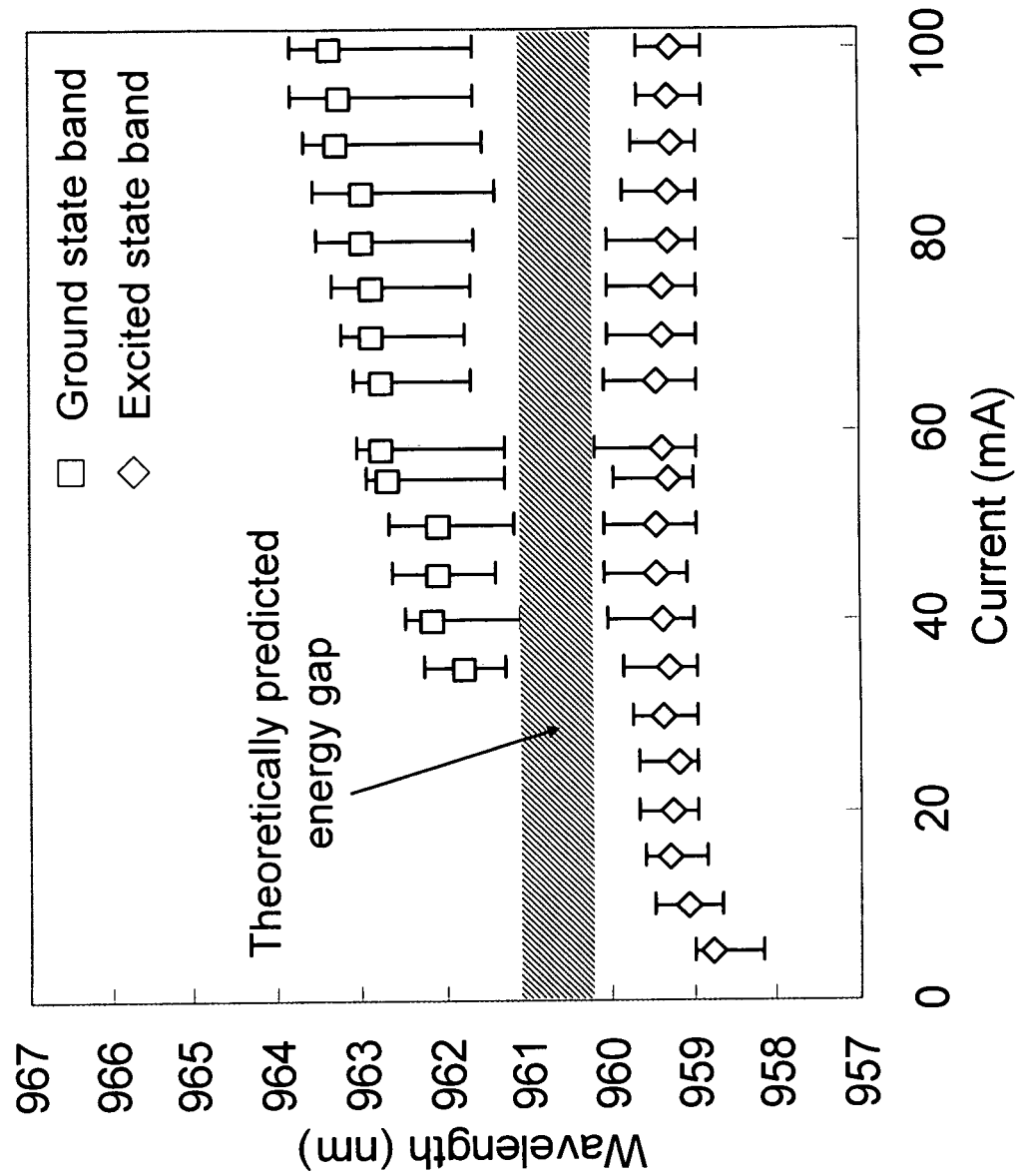
FIG. 7 plots theoretical peak wavelengths for the ground state band and excited state band emission from a nanopore laser device.

The excited state emission peak remains fairly constant both in wavelength and width over the entire range of injection currents. The ground state emission broadens with increased injection, which may be a result of gain-saturation effects. The emission stop band is present over the entire range of injection currents and has a width of just under 1 nm which is in approximate agreement with the theoretically predicted size of the intraband forbidden energy gap for this structure. FIG. 7 shows the width of the theoretically predicted stop band for the quantum nanopore laser of the invention. FIG. 7 plots the peak wavelengths for the ground state band and excited state band emission from a nanopore laser device. The error bars in the figure indicate the full-width at half-maximum of each peak. The shaded bar indicates the theoretically predicted width of the forbidden energy gap. The presence of the stop band in the series of spectra can be clearly seen by plotting the peak wavelength and full-width at half-max of the two peaks. The excited state emission peak remains fairly constant in width over the entire range of injection. The ground state emission peak broadens with increased injection. This is likely due to state filling effects in the ground state. Between the two peaks is a gap which is present over the entire range of injection. The width of the gap corresponds with the size of the theoretically predicted intraband energy gap.

Figure 8:
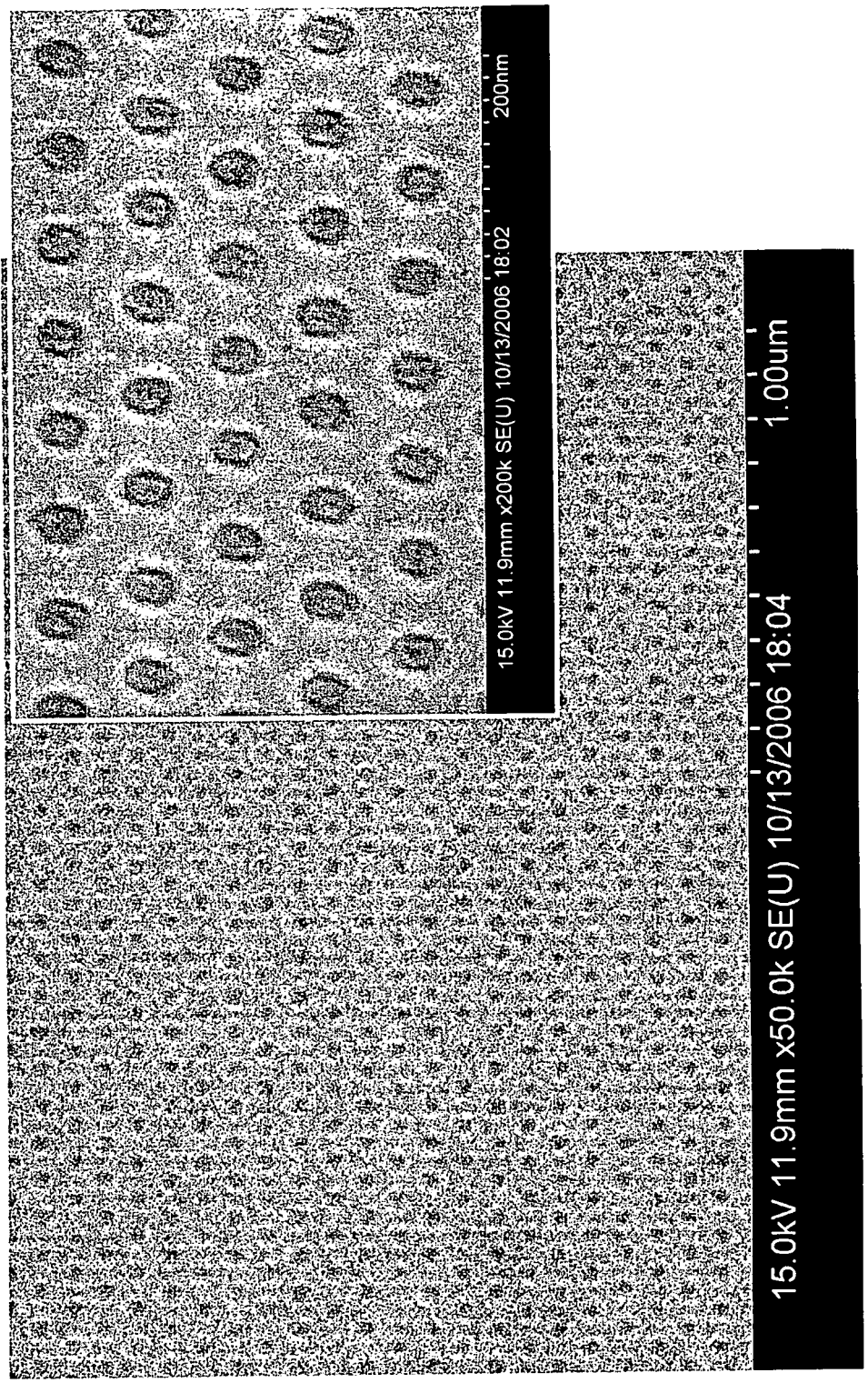
FIG. 8 shows a scanning electron microscope (SEM) image of the nanopore active layer after regrowth and removal of the silicon dioxide growth inhibiting dots.

FIG. 8 shows a scanning electron microscope (SEM) image of the nanopore quantum well after regrowth and removal of the silicon dioxide growth inhibiting dots. The resulting periodically perturbed quantum well is seen in the image.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A quantum well active region in an optoelectronic device, comprising:
    barrier layers of high bandgap material;
    a continuous quantum well layer of low bandgap material between and confined by the barrier layers; and
    within the continuous quantum well layer between and confined by the barrier layers, three-dimensional high bandgap barriers that perforate the continuous quantum well layer.

2. The quantum well active region of claim 1, wherein the high bandgap barriers comprise an ordered array that creates a periodic perturbation of the continuous quantum well layer.

3. A semiconductor laser, comprising:
    the quantum well active region according to claim 1,
    cladding layers around the quantum well active region;
    a waveguide structure; and
    electrical contacts.

4. A semiconductor laser, comprising:
    the quantum well active region according to claim 1,
    cladding around the quantum well active region; and
    waveguide means for confining light to induce lasing.

5. The laser according to claim 4, wherein the quantum well active region comprises a plurality of quantum well layers, including at least one quantum well layer having the high bandgap barriers.

6. The quantum well active region in an optoelectronic device of claim 1, wherein said continuous quantum well layer is 10s of nanometers or less thick.

7. The quantum well active region in an optoelectronic device of claim 6, wherein said continuous quantum well layer is in the range of 5-10 nm thick.

8. A quantum well active region in an optoelectronic device, comprising:
    barrier layers of high bandgap material;
    a continuous quantum well layer of low bandgap material between the barrier layers; and
    within the continuous quantum well layer, three-dimensional high bandgap barriers that perforate the continuous quantum well layer, wherein the high bandgap barriers comprise portions of one of the barrier layers that extends into perforation of the low bandgap material.

9. The quantum well active region of claim 8, wherein the low bandgap material of the continuous quantum well layer comprises InGaAs.

10. The quantum well active region of claim 9, wherein the material of one of the barrier layers comprises AlGaAs.

11. The quantum well active region of claim 10, wherein the material of the other of the barrier layers comprises GaAs.

12. A quantum well in an optoelectronic device, comprising:
    barrier layers of high bandgap material;
    a continuous quantum well layer of low bandgap material between and confined by the barrier layers; and
    three dimensional barrier means within the continuous quantum well layer for confining carriers.

13. The quantum well in an optoelectronic device of claim 12, wherein said continuous quantum well layer is 10s of nanometers or less thick.

14. The quantum well in an optoelectronic device of claim 13, wherein said continuous quantum well layer is in the range of 5-10 nm thick.

15. A quantum well active region in an optoelectronic device, comprising:
    barrier layers of high bandgap material;
    a continuous quantum well layer of low bandgap material between and confined by the barrier layers,
    an array of nanopores that perforate the continuous quantum well layer within a region of the continuous quantum well layer that is between and confined by the barrier layers; and
    a high bandgap barrier material within the nanopores.

16. The quantum well active region in an optoelectronic device of claim 15, wherein said continuous quantum well layer is 10s of nanometers or less thick.

17. The quantum well active region in an optoelectronic device of claim 16, wherein said continuous quantum well layer is in the range of 5-10 nm thick.

18. A quantum well active region in an optoelectronic device, comprising:
    barrier layers of high bandgap material;
    a continuous quantum well layer of low bandgap material between and confined by the barrier layers, and
    periodic perturbations of the low bandgap material of the continuous quantum well layer within a region of the continuous quantum well layer that is between and confined by the barrier layers.

19. The quantum well active region in an optoelectronic device of claim 18, wherein said continuous quantum well layer is 10s of nanometers or less thick.

20. The quantum well active region in an optoelectronic device of claim 19, wherein said continuous quantum well layer is in the range of 5-10 nm thick.

21. A method for forming a quantum well, the method comprising steps of:
- forming a quantum well barrier layer;
- forming a continuous quantum well layer with nanopores on the quantum well barrier layer;
- forming three-dimensional barriers in the nanopores; and
- forming a second quantum well barrier layer over the continuous quantum well layer including the portion of the layer having the nanopores and three-dimensional barriers.

22. The method of claim 21, wherein said step of forming the quantum well comprises forming the quantum well as an uninterrupted layer and then removing material to form the nanopores.

23. A method for forming a quantum well, the method comprising steps of:
- forming a quantum well barrier layer;
- forming a continuous quantum well layer with nanopores on the quantum well barrier layer; and
- forming three-dimensional barriers in the nanopores, wherein said step of forming the quantum well comprises:
- forming an array of nanometer scale growth inhibition dots on the quantum well barrier layer;
- forming the continuous quantum well layer;
- removing the growth inhibition dots to form the nanopores; and
- forming the three-dimensional barriers in the nanopores.

* * * * *

UNITED STATES PATENT AND TRADEMARK OFFICE
CERTIFICATE OF CORRECTION

PATENT NO. : 8,416,823 B2
APPLICATION NO. : 12/598224
DATED : April 9, 2013
INVENTOR(S) : Coleman et al.

Page 1 of 1

It is certified that error appears in the above-identified patent and that said Letters Patent is hereby corrected as shown below:

In the Specification:

Col. 1, line 21    Between "the" and "invention" delete "is".

Signed and Sealed this
Thirteenth Day of August, 2013

Teresa Stanek Rea
*Acting Director of the United States Patent and Trademark Office*